United States Patent
Brodoceanu et al.

(10) Patent No.: US 10,818,643 B1
(45) Date of Patent: Oct. 27, 2020

(54) RIGID PICKUP HEAD WITH CONFORMABLE LAYER

(71) Applicant: Facebook Technologies, LLC, Menlo Park, CA (US)

(72) Inventors: Daniel Brodoceanu, Cork (IE); Oscar Torrents Abad, Cork (IE); Ali Sengül, Zurich (CH); Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/732,723

(22) Filed: Jan. 2, 2020

Related U.S. Application Data

(60) Provisional application No. 62/904,478, filed on Sep. 23, 2019.

(51) Int. Cl.
| | |
|---|---|
| *H01L 25/075* | (2006.01) |
| *H01L 21/67* | (2006.01) |
| *F21V 23/06* | (2006.01) |
| *H01L 21/683* | (2006.01) |
| *H01L 33/00* | (2010.01) |
| *F21Y 115/10* | (2016.01) |

(52) U.S. Cl.
CPC .......... *H01L 25/0753* (2013.01); *F21V 23/06* (2013.01); *H01L 21/67098* (2013.01); *H01L 21/6835* (2013.01); *H01L 33/0093* (2020.05); *F21Y 2115/10* (2016.08); *H01L 2224/48249* (2013.01); *H01L 2933/0066* (2013.01)

(58) Field of Classification Search
CPC ........... H01L 25/0753; H01L 21/67098; H01L 21/6835; H01L 33/0079; H01L 23/06
See application file for complete search history.

(56) References Cited

U.S. PATENT DOCUMENTS

2018/0269234 A1\* 9/2018 Hughes ................. H01L 27/156

\* cited by examiner

*Primary Examiner* — Thomas M Sember
(74) *Attorney, Agent, or Firm* — Fenwick & West LLP

(57) ABSTRACT

Embodiments relate to using a pickup assembly to place light emitting diodes (LEDs) onto an electronic display substrate after fabrication of the LEDs. An LED assembly system places LEDs on a temporary substrate after fabrication. Pickup heads of the pickup assembly are coated with a conformable material to enable attachment of each LED to a pickup head. The pickup head removes the LEDs away from the temporary substrate and aligns the LEDs onto a target substrate. The LED assembly system provides heat to an electrode of the LEDs and a corresponding electrical contact pad of the target substrate. The pickup assembly applies force to the LED on the target substrate, such that with the heat, the electrode of the LED and the electrical contact pad are bonded. The pickup assembly releases the LED onto the target substrate.

16 Claims, 11 Drawing Sheets

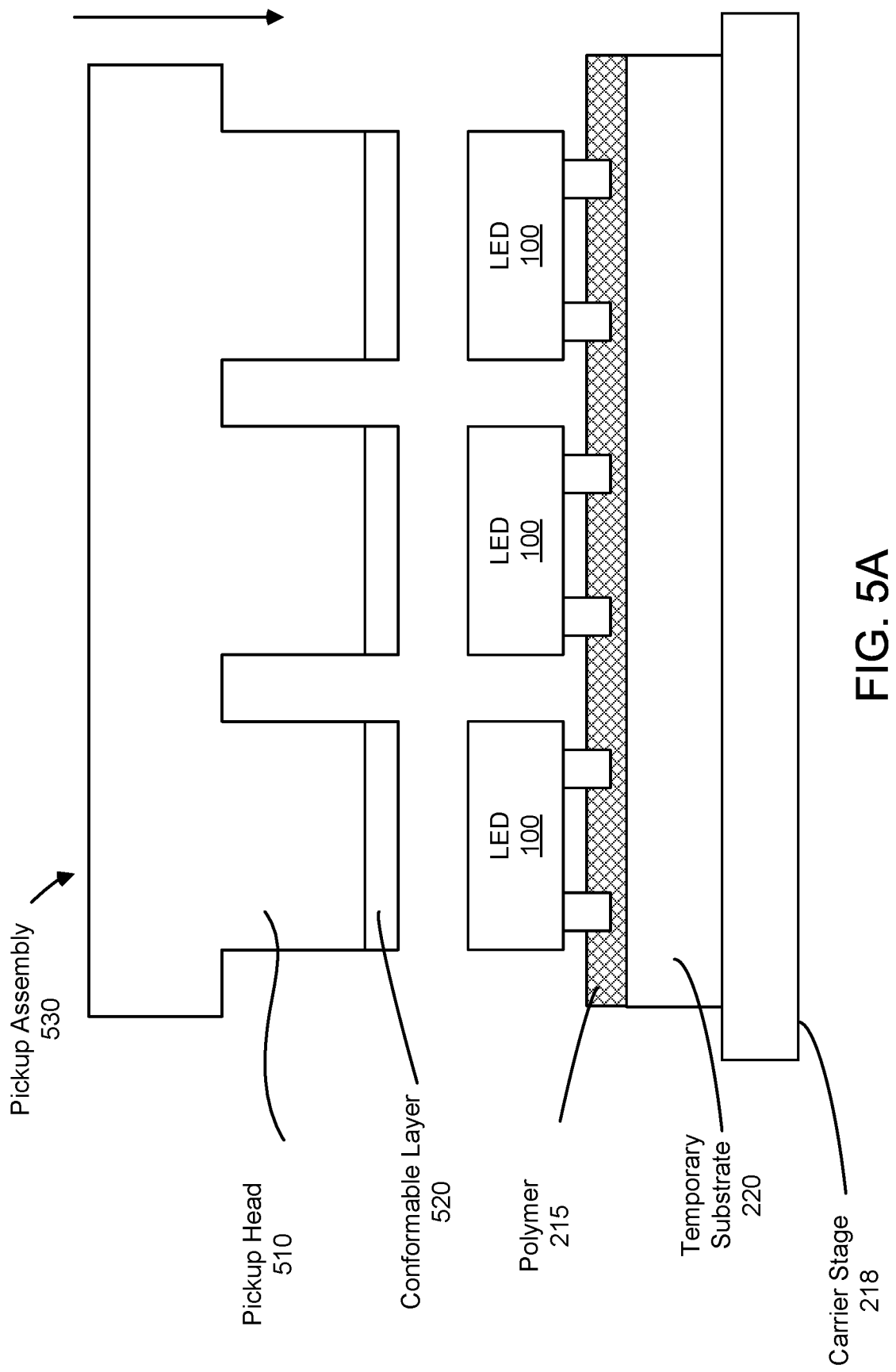

RIGID PICKUP HEAD WITH CONFORMABLE LAYER

CROSS-REFERENCE TO RELATED APPLICATION

This application claims priority under 35 U.S.C. § 119(e) to U.S. Provisional Patent Application No. 62/904,478 filed on Sep. 23, 2019, which is incorporated by reference herein in its entirety.

BACKGROUND

The present disclosure relates to semiconductor device fabrication, specifically to using a pickup assembly to place light emitting diodes (LEDs) on target substrates after fabrication.

In LED display fabrication, LEDs may be moved from one substrate to another. For example, micro-LEDs of different colors may be transferred from carrier substrates to a display substrate including control circuits for the micro-LEDs to manufacture an electronic display. As the form factor of LED's decreases, the picking and placing of LEDs into desired arrangements and without damaging the LEDs becomes increasingly difficult.

SUMMARY

Embodiments relate to using a pickup assembly to move semiconductor devices from one substrate to another substrate. Using a pickup assembly may facilitate pick and place operations during the manufacturing of an electronic display.

In some embodiments, a conformable layer is placed at an end of a pickup head, the pickup head a component of a pickup assembly, on a top surface of a light emitting diode (LED) placed on a temporary substrate. The LED attaches to the conformable layer. The pickup head is made of a material having a coefficient of thermal expansion substantially identical to a coefficient of thermal expansion of a body of the LED. The LED is removed from the temporary substrate by a relative movement between the pickup head and the temporary substrate. The LED is placed onto a target substrate by relative movement between the pickup head and the target substrate. An electrode of the LED is bonded to a corresponding electrical contact pad of the target substrate by increasing the temperature of the electrode and the corresponding pad.

In some embodiments, an apparatus comprises a pickup head of a material having a coefficient of thermal expansion substantially identical to a coefficient of thermal expansion of a body of a LED. The apparatus includes a conformable layer on an end of the pickup head and the conformable layer attaches the LED to the pickup head. The apparatus also includes an actuator coupled to the pickup head, wherein the actuator causes relative movement between the pickup head and a target substrate.

BRIEF DESCRIPTION OF DRAWINGS

FIG. 5A illustrates a cross-sectional view of the LEDs on the temporary substrate and a pickup assembly, in accordance with an embodiment.

The figures depict various embodiments of the present disclosure for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments relate to placing light emitting diodes (LEDs) from a substrate onto a target substrate, after the LEDs are fabricated, using a pickup assembly. The pickup assembly includes one or more pickup heads, each coated with a conformable layer. One or more of the LEDs placed on a temporary substrate are picked up from the temporary substrate by the pickup assembly. To facilitate the pickup assembly's adhesion to the LEDs, a conformable layer is applied across surfaces of the pickup heads of the pickup assembly. The pickup assembly moves the one or more LEDs away from the temporary substrate and places them onto a target substrate of an electronic display.

Embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Example LED Structure

Figure 1:
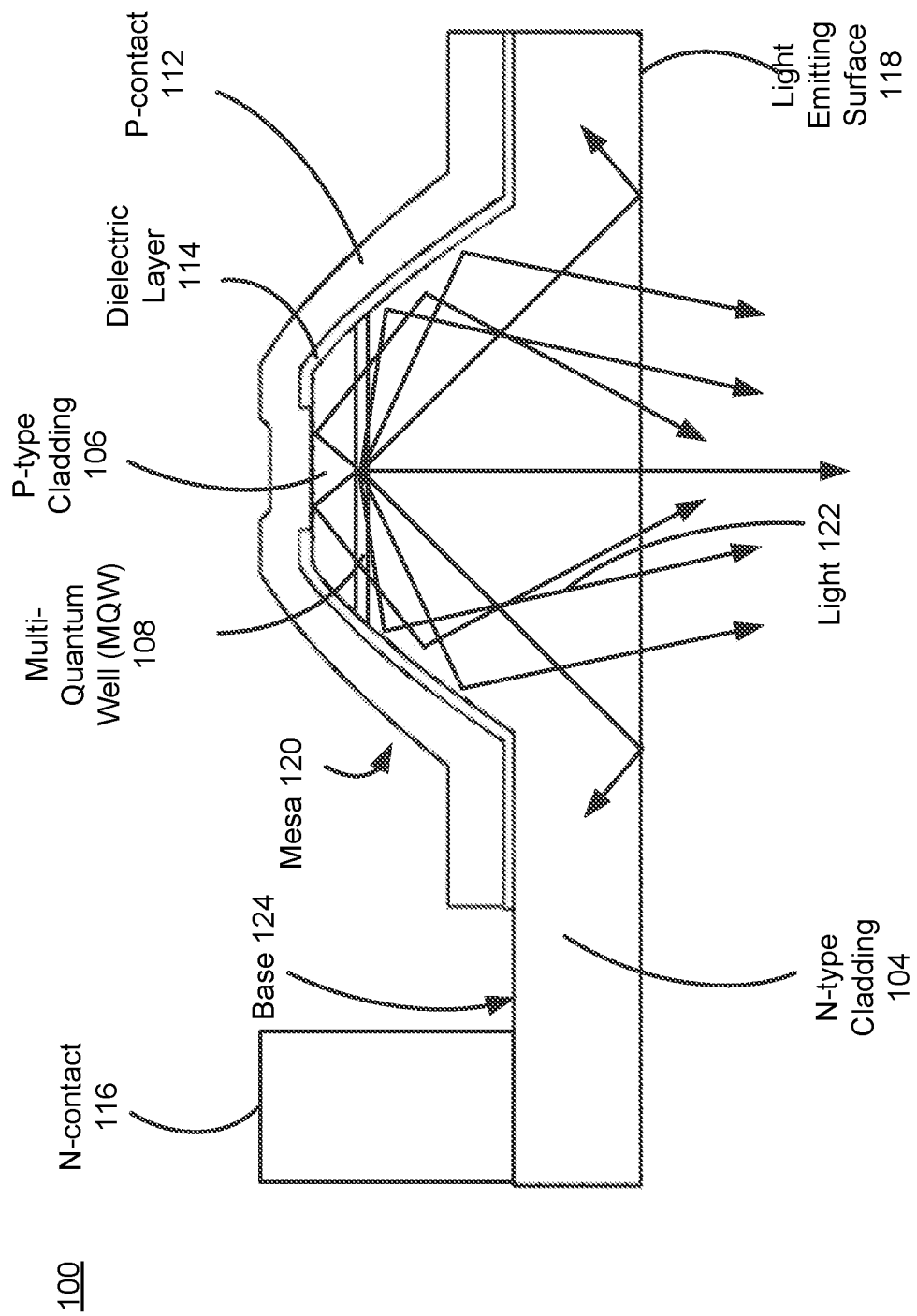
FIG. 1 illustrates a cross-sectional view of a LED, in accordance with an embodiment.

FIG. 1 illustrates a cross-sectional view of a LED 100, in accordance with an embodiment. The LED 100 is an example of a semiconductor device on which a curable (e.g., photocurable or thermally curable) polymer layer is formed to facilitate pick and place of the semiconductor device from a temporary substrate to a target substrate. In some embodiments, the LED 100 may be a micro LED. In some embodiments, the feature size of the micro LED (e.g., the diameter) may range from sub-micrometers to tens of micrometers (e.g., from 0.1 µm to 10 µm) and have a small active light emitting area (e.g., less than 2,000 µm$^2$). The collimated light output increases the brightness level of light emitted from the small active light emitting area. The micro LED may be one of many micro LEDs of an array on a target substrate, with the pitch (e.g., spacing between micro LEDs) ranging from sub-micrometers to tens of micrometers.

The LED 100 may include, among other components, a semiconductor structure including a body with an n-type cladding 104, a p-type cladding 106, and a multi-quantum well ("MQW") 108 between the n-type cladding 104 and the p-type cladding 106. The LED 100 further includes a dielectric layer 114 on the semiconductor structure, a p-contact 112 on the dielectric layer 114, and an n-contact 116 on the n-type cladding 104. The semiconductor structure is shaped, such as via an etch process, into a mesa 120 and a base 124 of the mesa 120. The p-type cladding 106 defines the top of the mesa 120, and the n-type cladding 104 defines a portion of the mesa 120 and the base 124. In some embodiments, an n-type cladding defines the top portion of the mesa 120 and a p-type cladding defines the bottom portion of the mesa 120 and the base 124. Here, the p-contact 112 is an n-contact and the n-contact 116 is a p-contact.

The multi-quantum well 108 defines an active light emitting area that is included in the structure of the mesa 120. The LED 100 may include one or more quantum wells. The mesa 120 may include a truncated top defined on a side opposed to a light emitting surface 118 of the LED 100. In some embodiments, the semiconductor structure including the n-type cladding 104, MQW 108, and p-type cladding 106 is an epitaxial structure grown on a growth substrate. A photosensitive polymer may be formed on the light emitting surface 118.

The mesa 120 may include various shapes, such as a parabolic shape with a truncated top, to form a reflective enclosure for light 122 generated within the LED 100. In other embodiments, the mesa 120 may include a cylindrical shape with a truncated top, or a conic shape with a truncated top, or some other light-collimating shape. The arrows show how the light 122 emitted from the MQW 108 is reflected off the p-contact 112 and internal walls of the mesa 120 toward the light emitting surface 118 at an angle sufficient for the light to escape the LED 100 (i.e., within a critical angle of total internal reflection). The p-contact 112 and the n-contact 116 are examples of contacts of the LED 100, and electrically connect the LED 100, such as to a display substrate including a control circuit for the LED 100. The n-contact 116 is formed at the base 124, which is defined by a surface of the n-type cladding 106 opposite the light emitting surface 118. The n-contact 116 may include a conductive material that extends to the top of the mesa 120 to support the placement of the LED 100 on the display substrate with the p-contact 112 and the n-contact 116 bonded to the display substrate.

The LED 100 may include an active light emitting area defined by the MQW 108. The LED 100 directionalizes the light output from the MQW 108 and increases the brightness level of the light output. In particular, the p-contact 112 may be reflective for the light 122 emitted from the MQW 108. The mesa 120 and p-contact 112 cause reflection of the light 122 from the MQW 108 to form a collimated or quasi-collimated light beam emerging from the light emitting surface 118.

The mesa 120 may be formed by etching into the semiconductor body including the n-type cladding 104, the MQW 108, and the p-type cladding 106, during wafer processing steps. The etching results in the MQW 108 being in the structure of the mesa 120, and at a particular distance to the p-contact 112 to facilitate the collimation of the light 122. In some embodiments, the MQW 108 is at a parabola focal point defined by the parabolic shape of the mesa 120. A portion of the generated light 122 is reflected at the mesa 120 to form the quasi-collimated light beam emitted from the light emitting surface 118.

While this application discusses primarily micro LEDs, in other embodiments the LEDs 100 may comprise any semiconductor device having a gallium semiconductor layer, including semiconductor devices including gallium-based epitaxial layers grown on substrates.

Example Process of LED Display Pickup and Placement

Figure 2:
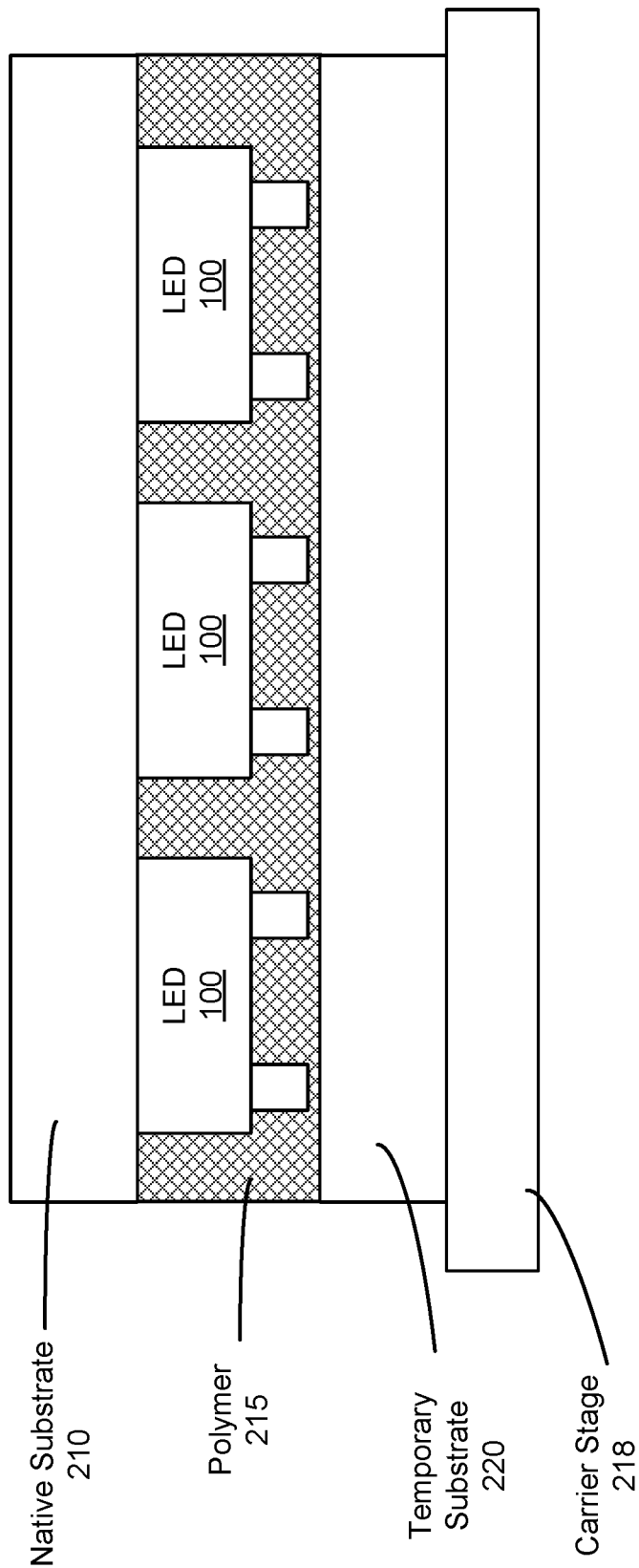
FIG. 2 illustrates a cross-sectional view of LEDs on a temporary substrate, in accordance with an embodiment.
Figure 3:
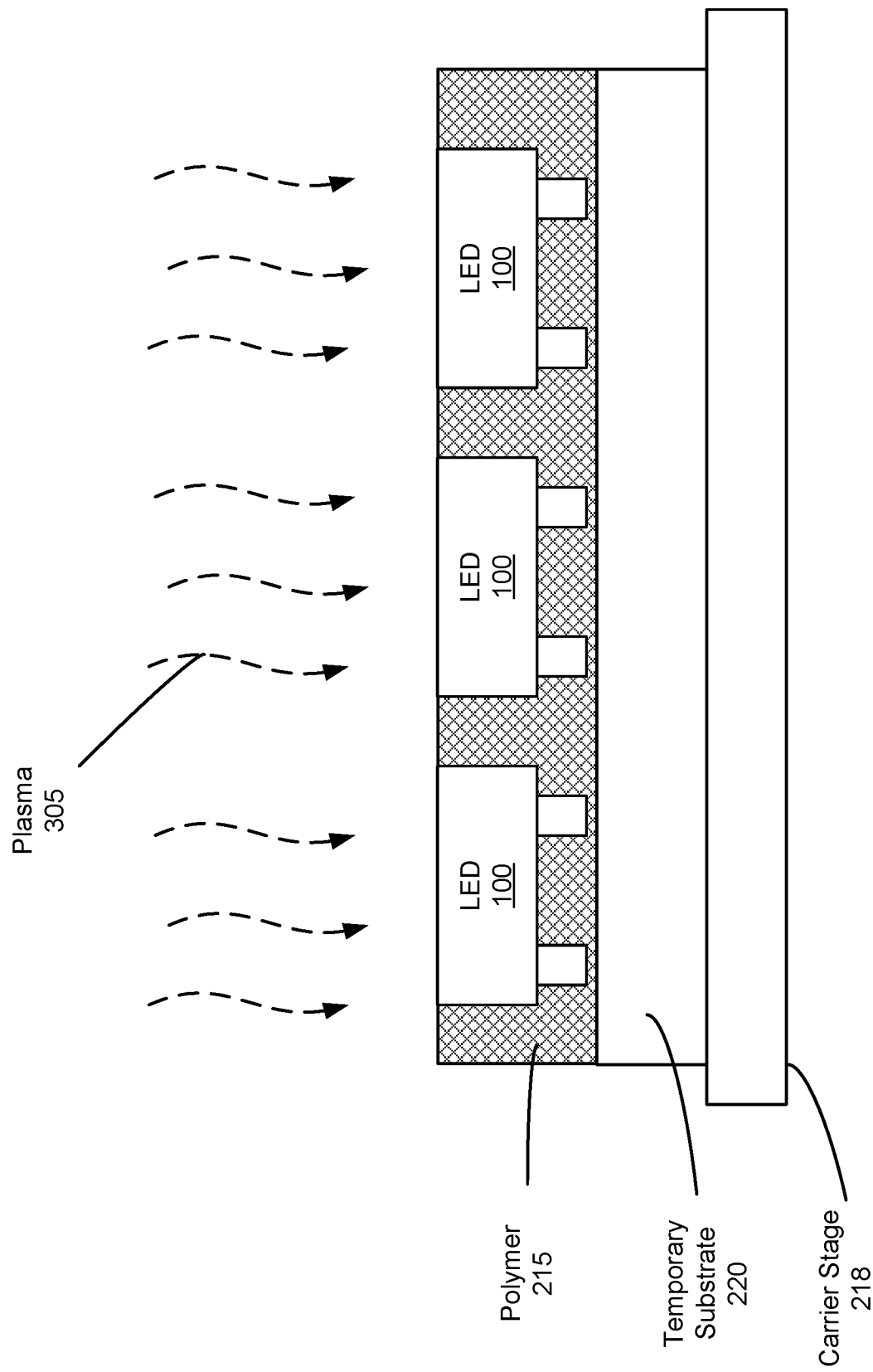
FIG. 3 illustrates a cross-sectional view of LEDs on the temporary substrate with plasma directed to a polymer coupled to the LEDs, in accordance with an embodiment.

FIG. 2 illustrates a cross-sectional view of LEDs 100 on a temporary substrate 220, in accordance with an embodiment. Post fabrication of the LEDs 100, an LED assembly system includes the LEDs 100, a native substrate 210, a polymer 215, a carrier stage 218, and a temporary substrate 220. The LEDs 100 are formed on the native substrate 210. The native substrate 210 may be sapphire (single-crystal) or Gallium Arsenide (GaAs), for example. The LED assembly system attaches the LEDs 100 to the temporary substrate 220, via the polymer 215 (e.g., a resin), on a carrier stage 218. The temporary substrate 220 may be made of a material (e.g., glass) with sufficient strength to provide support for the LEDs 100 during transport or other processes before moving the LEDs 100 onto a target substrate. The native substrate 210 may be detached from the LEDs 100 by directing a laser through the native substrate. The laser causes a reaction at the interface of the LEDs 100 and the native substrate 210, subsequently weakening the bonding between the LEDs 100 and the native substrate 210. The weakening of the bonding enables the native substrate 210 to be removed away from the LEDs 100 while retaining the LEDs 202 attached to the temporary substrate 220 via the polymer 215. Such process is referred to as a laser lift-off process. The carrier stage 218 secures the temporary substrate 220 for further operations, and may include a heat source that heats the carrier stage 310 to a temperature for subsequent operations. The removal of the native substrate 210 results in the structure as illustrated in FIG. 3. In some embodiments, the native substrate 210 may be removed by wet etching. For example, if the native substrate 210 is made of GaAs, the native substrate 210 may be removed by exposure to citric acid and/or phosphoric acid mixed with hydrogen peroxide.

FIG. 3 illustrates a cross-sectional view of the LEDs 100 on the temporary substrate 220 with plasma 305 directed to a polymer coupled to the LEDs, in accordance with an embodiment. The plasma 305 removes a portion of the polymer (e.g., the polymer 215) that couples the LEDs 100 to the temporary substrate 220. By exposing the polymer 215 to the plasma 305 (e.g., radio frequency plasma), the polymer is at least partially removed to facilitate the subsequent step of removing the LEDs 100 from the temporary substrate 220.

Figure 4:
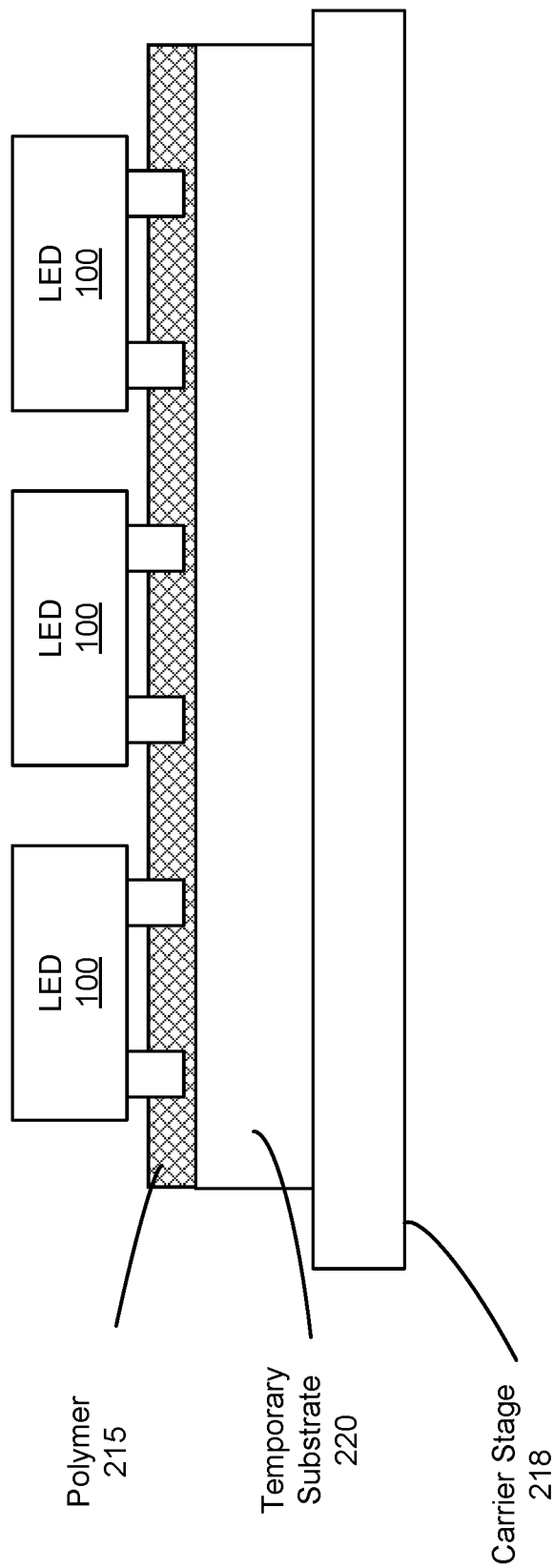
FIG. 4 illustrates a cross-sectional view of the LEDs on the temporary substrate with a portion of the polymer removed, in accordance with an embodiment.

FIG. 4 illustrates a cross-sectional view of the LEDs 100 on the temporary substrate 220 with a portion of the polymer 215 removed, in accordance with an embodiment. Removing a portion of the polymer 215 facilitates the removal of the LEDs 100 away from the temporary substrate 220.

Figure 5B:
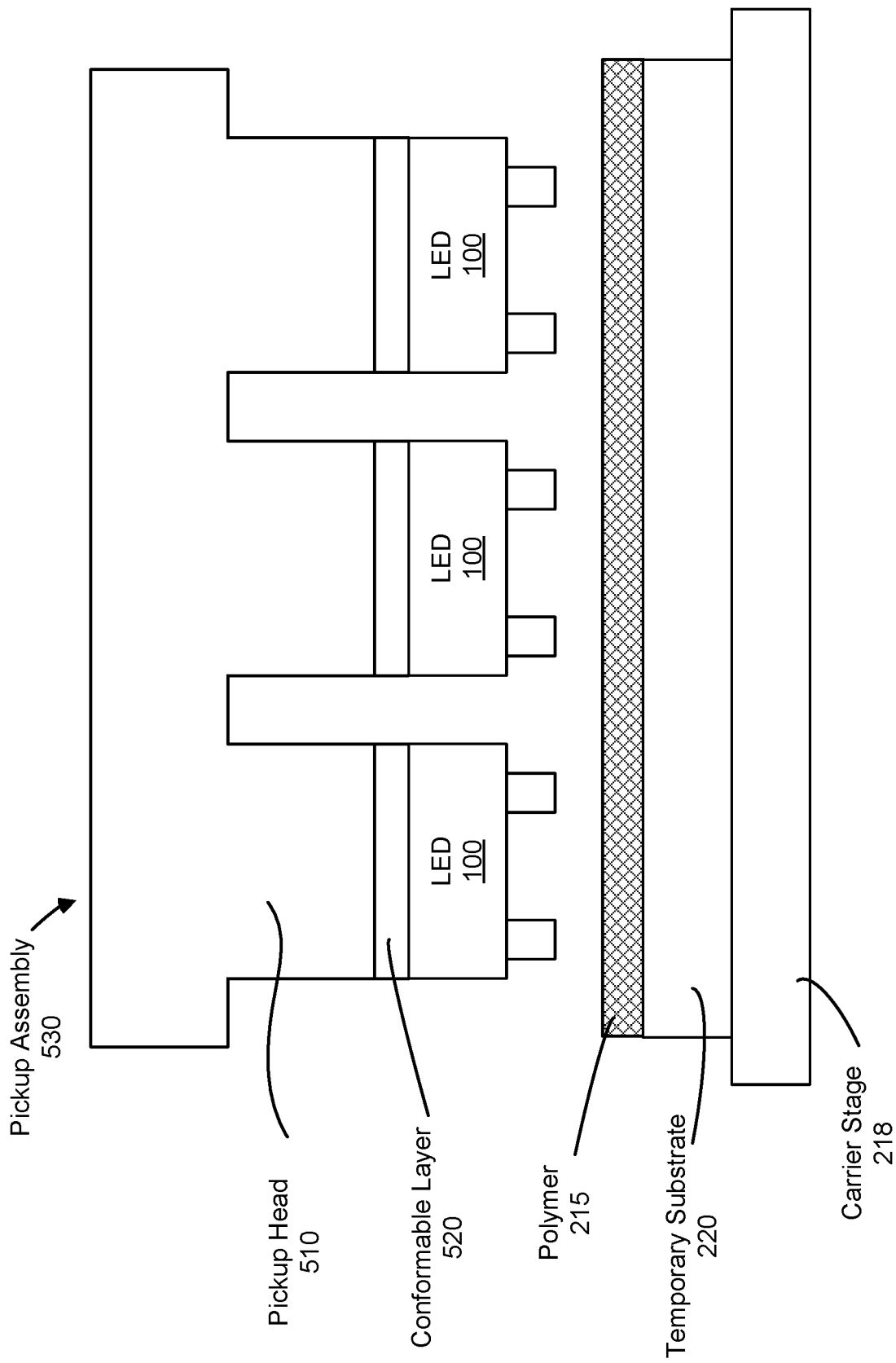
FIG. 5B illustrates a cross-sectional view of the LEDs removed away from the temporary substrate by the pickup assembly, in accordance with an embodiment.

FIG. 5A illustrates a cross-sectional view of the LEDs 100 on the temporary substrate 220 and a pickup assembly 530, in accordance with an embodiment. The pickup assembly 530 removes a subset of the LEDs 100 from the temporary substrate 220 and place the subset of LEDs 100 onto a target substrate 560. The pickup assembly 530 includes at least one pickup head 510 and a conformable layer 520. Each pickup head 510 attaches to at least one LED 100, via the conformable layer 520. Each of the pickup heads 510 may have a body made of a material that has a coefficient of thermal expansion (CTE) that is substantially identical to a CTE of a body of the LED 100. The CTE of the body of each pickup head 510 has a CTE that is substantially identical to the CTE of the LED 100 such that the thermal stress due to CTE difference between the pickup head 510 and the LED 100 does not deform or crack the LED during temperature fluctuations in the LED assembly process. A substantially identical match between the CTEs of the body of the pickup head 510 and the LED 100 also helps maintain lateral alignment between the LED 100 and the target substrate 560 during bonding. Each pickup head 510 may be made of fused silica or a similar hard material. Accordingly, when each LED 100 is being placed on the target substrate, an increased temperature may bond the LED 100 to the target substrate. When the LED 100 is placed on the target substrate, the pickup head 510 does not experience significant deformation (e.g., buckling) as compared to a pickup head made of a softer material. The conformable layer 520 attaches the LED 100 onto the pickup head 510. The end of the pickup head 510 may align with a top surface of an LED 100. The conformable layer 520 may include polydimethylsiloxane (PDMS), polyurethane (PU), or some combination thereof. FIG. 5B illustrates a cross-sectional view of the LEDs 100 removed away from the temporary substrate 220 by the pickup assembly 530, in accordance with an embodiment. Relative movement between the pickup assembly 530 and the temporary substrate 220 removes the LEDs 100 from the temporary substrate 220. In one embodiment, the pickup assembly 530 may move towards the LEDs 100, which are positioned on the carrier stage 218, and adhere to the LEDs 100 via the conformable layer 520. Once the pickup assembly 530 adheres to the LEDs 100, the pickup assembly 530 may lift the LEDs 100 off the temporary substrate 220. In some embodiments, the carrier stage 218 may be removed from beneath the temporary substrate 220, removing the LEDs 100 away from the temporary substrate 220. In some embodiments, a plurality of LEDs may be removed from the temporary substrate 220 at one time by a plurality of pickup heads of the pickup assembly 530.

Figure 5C:
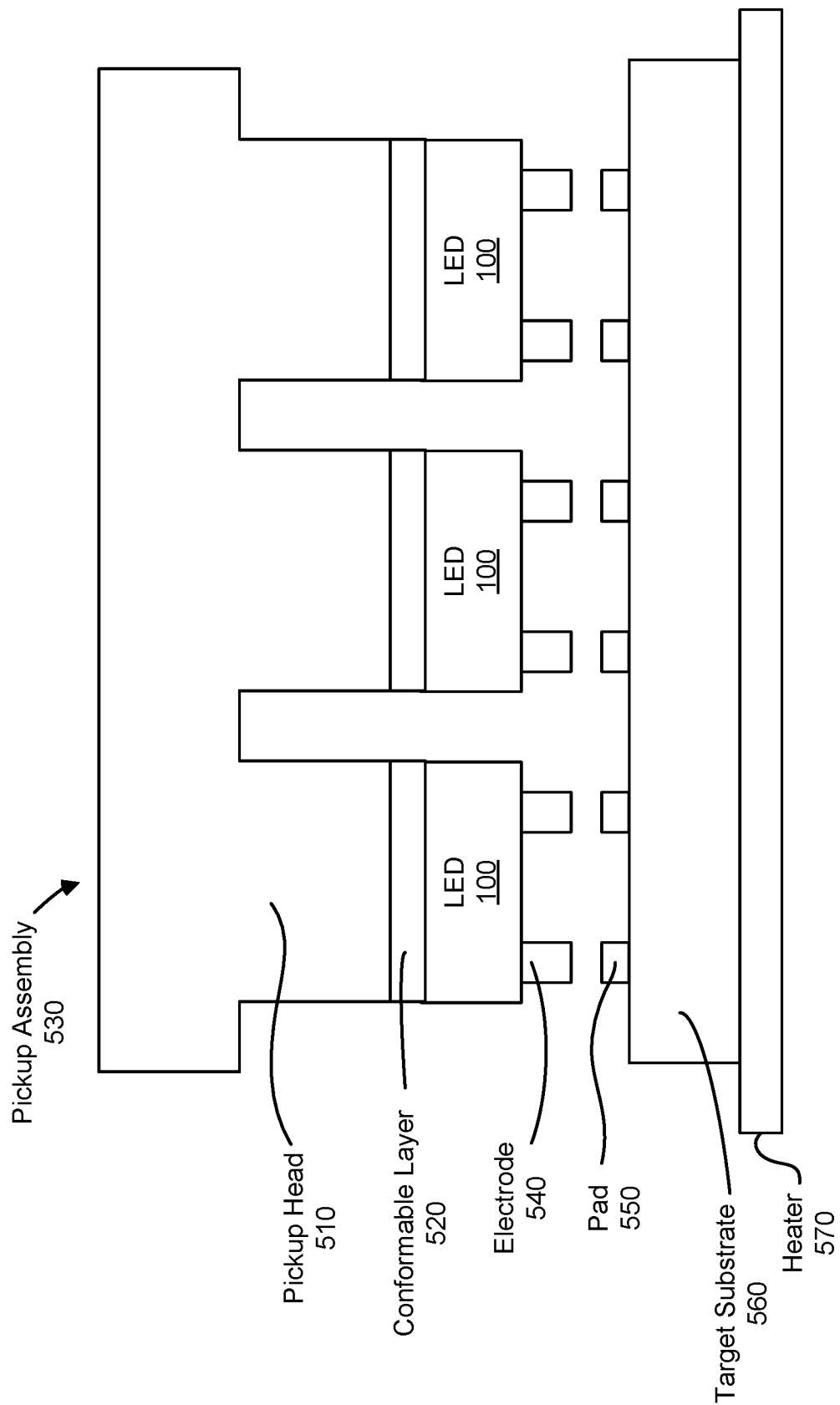
FIG. 5C illustrates a cross-sectional view of aligning the LEDs with pads on a target substrate by the pickup assembly, in accordance with an embodiment.

FIG. 5C illustrates a cross-sectional view of aligning the LEDs 100 with pads 550 on the target substrate 560 by the pickup assembly 530, in accordance with an embodiment. The pickup assembly positions the LEDs 100 on the target substrate 560. The target substrate 560 may also be referred to as a display substrate, where a plurality of LEDs 100 may be positioned to form an electronic display. The target substrate 560 may include a pixel control circuit of an electronic display. The target substrate 560 couples to a heater 570. The target substrate 560 includes one or more electrical contact pads 550. Each electrical contact pad 550 is configured to bond to an electrode 540 of an LED 100 to power the LED 100.

After aligning the LEDs 100 with the target substrate 560, the LED assembly system bonds each of the electrodes 540 of the LEDs 100 to the corresponding pad 550. The LED assembly system bonds the electrodes 540 to corresponding pads 550 via thermal compression bonding. The heater 570, coupled to the target substrate 560, produces heat to increase a temperature of the electrode 540 and the pad 550. The pickup assembly 530 may press down, applying force via each pickup head 510, on the electrode 540 and the pad 550. The increased temperature of the electrode 540 and the pad 550 results in thermal stress in the LED 100 due to slight mismatches in the CTE of the LED 100 body and the pickup head 510. The thermal compression results in the electrode 540 bonding to the pad 550. In some embodiments, the LED assembly system may not include the heater 570, and the electrode 540 and the pad 550 may be heated in other ways. In some embodiments, once the electrode 540 and the corresponding pad 550 are aligned on the target substrate 560, a laser may be directed through the pickup head 510 to bond the electrode 540 and the pad 550 via laser bonding. Note that the pickup head 510 may be optically transparent and/or translucent to allow the laser beam through. In other embodiments, the LED electrode-electrical contact pad bonding may occur via wire bonding, surface activated bonding, or some combination thereof.

Figure 5D:
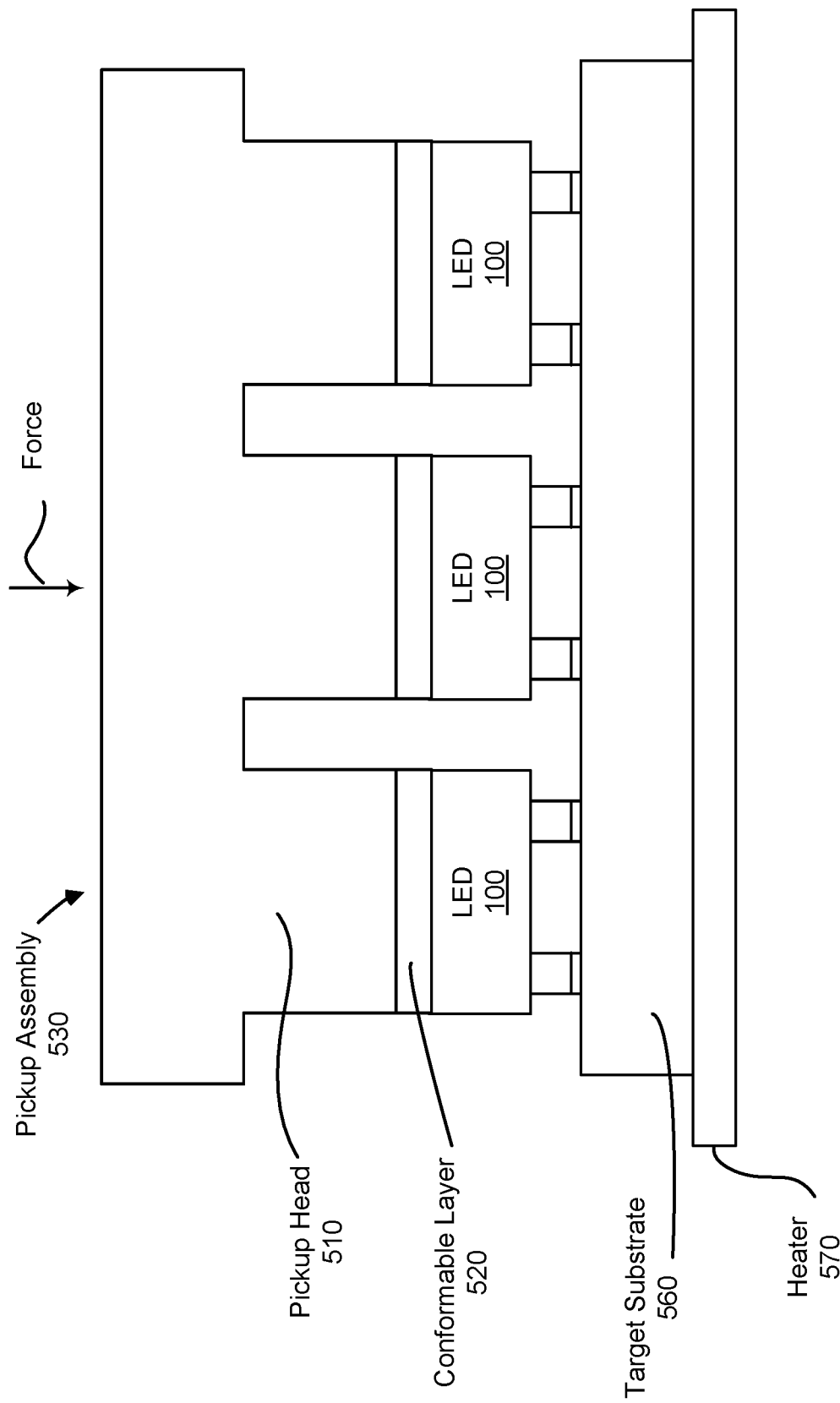
FIG. 5D illustrates a cross-sectional view of the LEDs bonded to the target substrate, in accordance with an embodiment.

FIG. 5D illustrates a cross-sectional view of the LEDs 100 bonded to the target substrate 560, in accordance with an embodiment. Each electrode of the LED 100 is bonded to a corresponding electrical pad of the target substrate 560, due to heat provided by the heater 570 and force applied by the pickup assembly 530. In some embodiments, a plurality of LEDs are simultaneously bonded to the target substrate by a plurality of pickup heads of the pickup assembly 530.

Figure 5E:
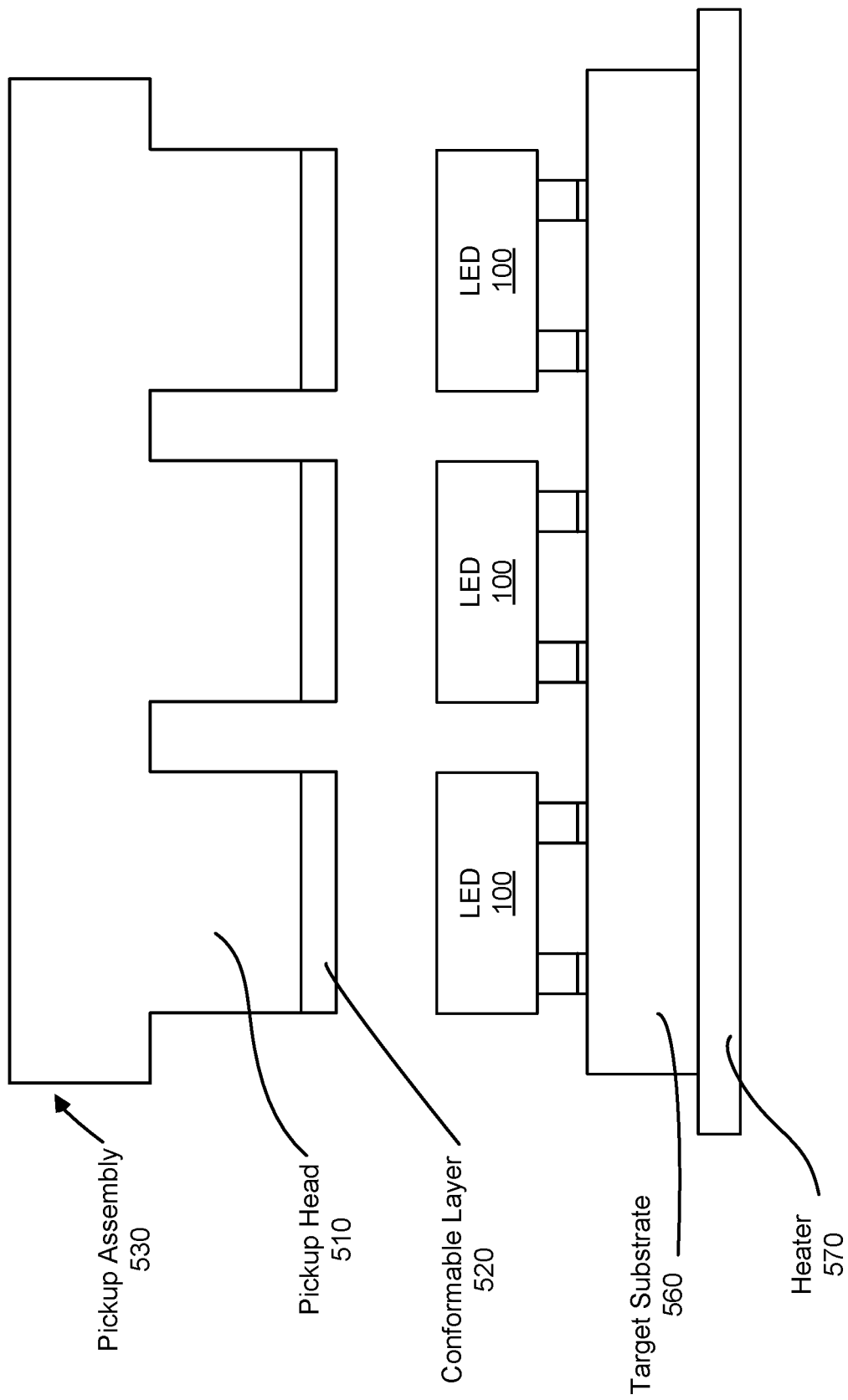
FIG. 5E illustrates a cross-sectional view of the LEDs released onto the target substrate, in accordance with an embodiment.

FIG. 5E illustrates a cross-sectional view of the LEDs 100 released onto the target substrate 560, in accordance with an embodiment. After or during bonding of the LED 100 to the target substrate 560, the pickup head 510 detaches from and releases the LEDs 100 onto the target substrate 560. As each pickup head 510 may be used multiple times, for multiple subsets of LEDs. In some embodiments, the conformable layer may remain on the pickup assembly with each use of the pickup head 510.

Figure 6:
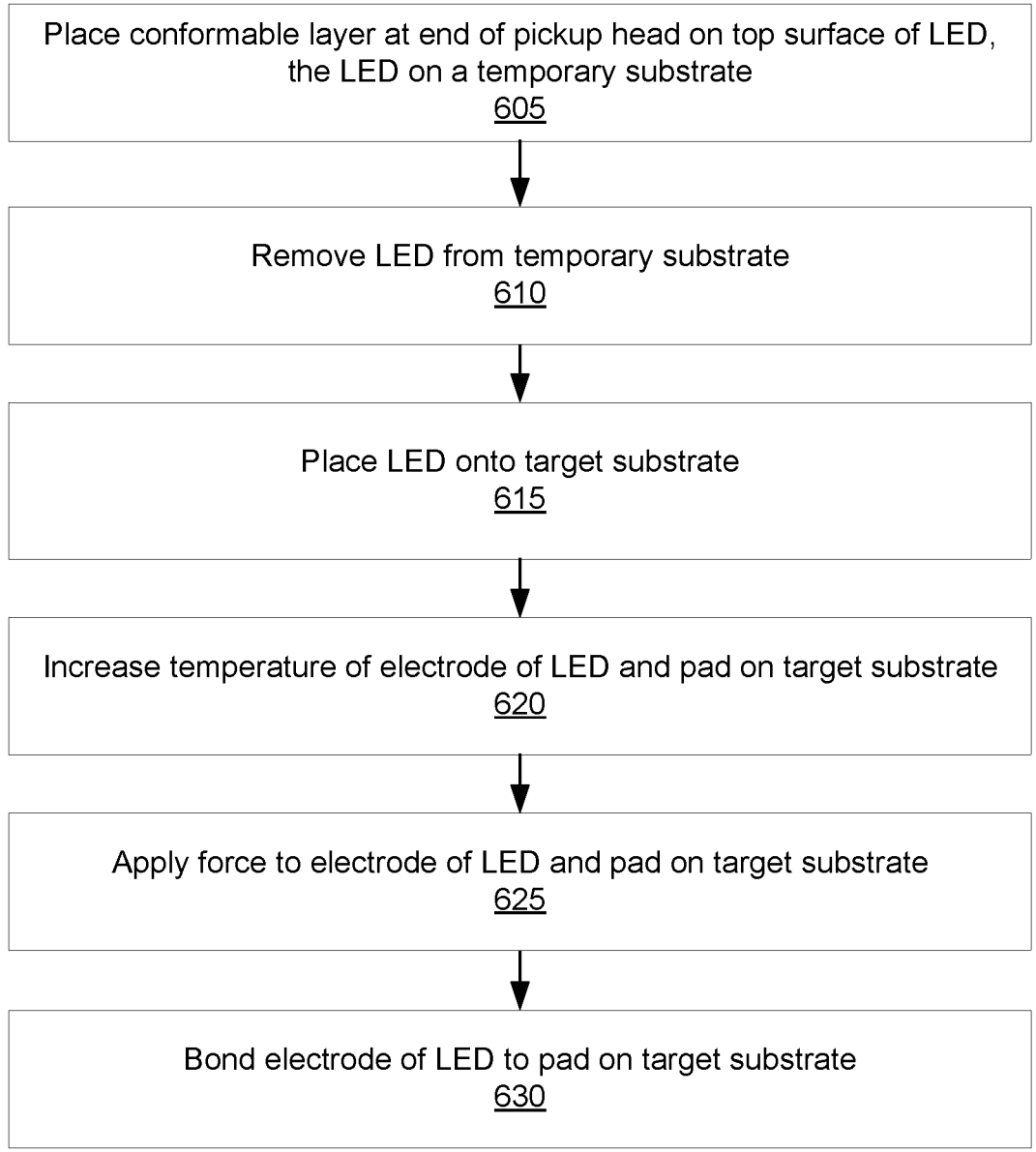
FIG. 6 is a flowchart illustrating a process for placing LEDs on the target substrate, in according with an embodiment.

FIG. 6 is a flowchart illustrating a process for placing LEDs on a target substrate, in according with an embodiment.

An LED assembly system places 605 a conformable layer at an end of a pickup head on a top surface of an LED (e.g., the LEDs 100), wherein the LED is on a temporary substrate (e.g., the temporary substrate 220).

The LED assembly system removes 610 the LED from the temporary substrate.

The LED assembly system places 615 the LED onto a target substrate (e.g., the target substrate 560).

The LED assembly system increases 620 a temperature of an electrode of the LED (e.g., the electrode 540) and a corresponding pad of the target substrate (e.g., the pad 550).

The LED assembly system applies 625 a force to the electrode of the LED and the corresponding pad of the target substrate.

The LED assembly system bonds 630 the electrode of the LED to the corresponding pad of the target substrate.

The processes illustrated in FIG. 6 may be performed in a different order or the processes may be omitted. For example, removing 610 the LED from the temporary substrate may be performed in parallel with the removing 615 of the portion of the polymer via dry etching.

Figure 7:
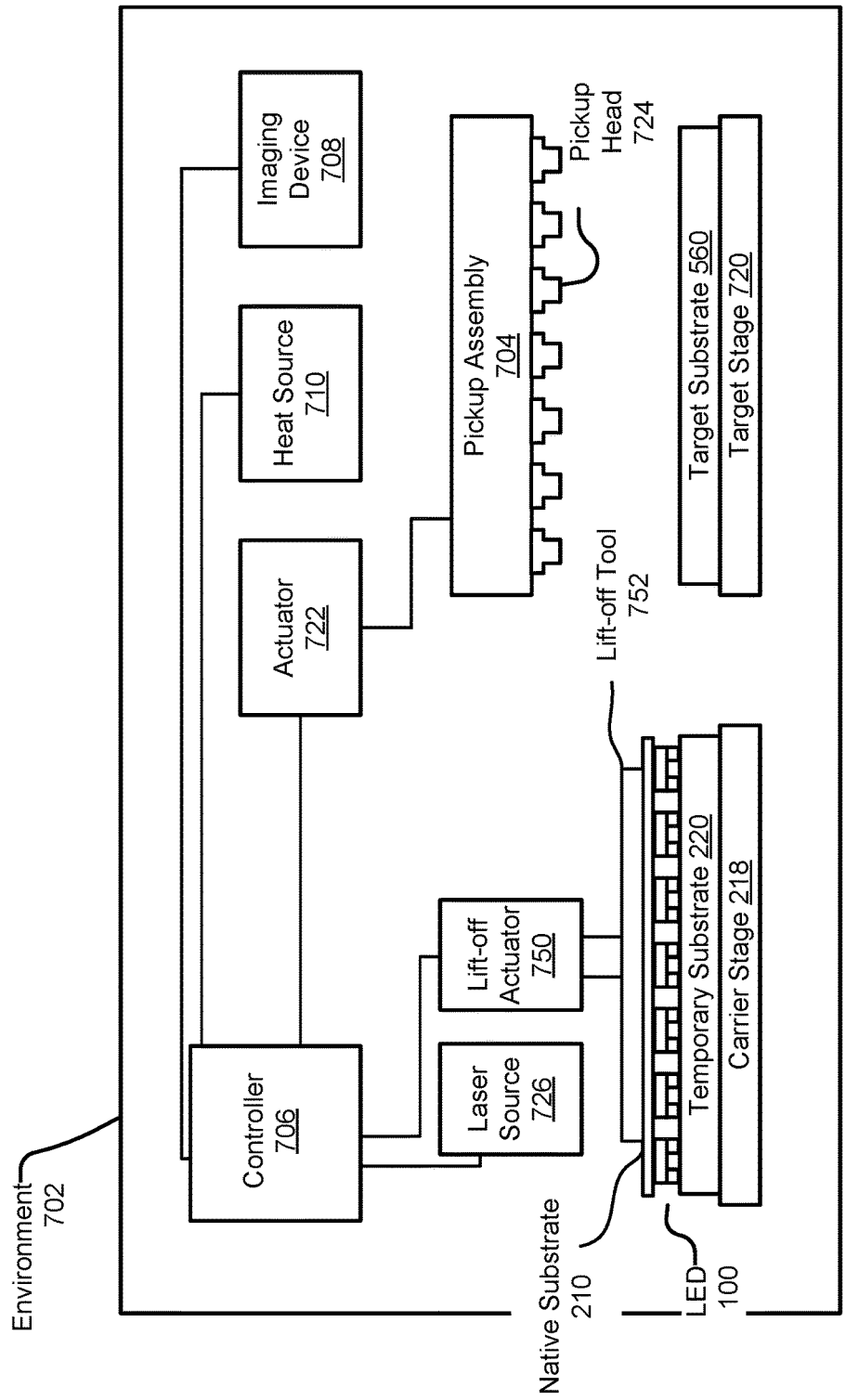
FIG. 7 is a system diagram of a display assembly system, in accordance with an embodiment.

FIG. 7 is a system diagram of an LED assembly system 700, in accordance with an embodiment. The system 700 fabricates a display device by assembling a plurality of LEDs 100 onto the target substrate 560. In some embodiments, the LEDs 100 are different color light emitting diode (LED) dies. The temporary substrate 220 may be a carrier film that holds the LEDs 100 for pick up by the pickup assembly 704.

The target substrate 560 may be a display substrate, or may be an intermediate carrier substrate that facilitates bonding with a display substrate. The system 700 places LEDs 100 at pixel locations of the display substrate, and then bonds the LEDs 100 to the display substrate. In some embodiments, the LEDs 100 are micro LEDs having a reduced divergence of light output and small light emitting area is comparison to conventional LEDs.

The system 700 includes an environment 702 for picking and placing LEDs 100. The system 700 further includes a pickup assembly 704, an imaging device 708, a heat source 710, an actuator 722, the carrier stage 316, a target stage 720, a lift-off actuator 750, and a lift-off tool 752. In some embodiments, the environment 702 is an interior environment of a SEM chamber and the imaging device 708 is a scanning electron microscope (SEM).

The carrier stage 316 holds the temporary substrate 220, which holds the LEDs 100. The target stage 720 holds the target substrate 560 to receive some or all of the LEDs 100 from the temporary substrate 220. A controller 706 is coupled to the imaging device 708 and the pickup assembly 704 (e.g., via the actuator 722) and controls the operations of the imaging device 708 and pickup assembly 704. For example, the controller 706 causes the pickup assembly 704 to pick up one or more LEDs 100 located on the temporary substrate 220, and place the one or more LEDs 100 on the target substrate 560. The target stage 720 may include a heater (e.g., the heater 570) to facilitate thermal bonding between the LEDs 100 and the target substrate 560. The target stage 720 may couple to the heat source 710 in providing heat to the target substrate 560.

The pickup assembly 704 includes a plurality of pickup heads 724 (e.g., the pickup head 510). Each pickup head 724 includes a conformable layer that can attach to a semiconductor device. Each pickup head 724 can pick up the LEDs 100, via the conformable layer, from the temporary substrate 220, and place the LEDs 100 on the target substrate 560. After picking up an LED 100, the pickup head 724 is aligned with a location on the target substrate 560. The pickup head 724 is then separated from the LED 100 after placing the LED 100 at the location on the target substrate 560. In some embodiments, the system 700 includes a conformable layer application tool that removes a conformable layer after the pickup head 724 releases an LED 100 onto the target substrate 560. The conformable layer application tool may be configured to reapply another layer of conformable material onto each pickup head, allowing the pickup head 724 to pick and place another LED 100.

The actuator 722 is an electro-mechanical component that controls the movement of the pickup assembly 704 based on instructions from the controller 706. For example, the actuator 722 may move the pickup assembly 704, or individual pickup heads 724, in three-dimensional space, along the XYZ axes, and with three degrees of freedom including up and down, left and right, and forward and back. In various embodiments, the actuator 722 may be, for example, a rotating motor, a linear motor, or a hydraulic cylinder.

The imaging device 708 facilitates a visual alignment for LED pickup from the temporary substrate 220, and alignment for the placement of LEDs on the target substrate 560. For example, the imaging device 708 generates images of the pickup assembly 704 and the temporary substrate 220, and provides the images to the controller 706. The controller 706 aligns the one or more pickup heads 724 of the pickup assembly 704 with the temporary substrate 220 based on the images, and picks up one or more LEDs 100 mounted on the temporary substrate 220. As another example, the imaging device 708 generates images of the one or more pickup heads 724 of the pickup assembly 704 and the target substrate 560, and provides the images to the controller 706. The controller 706 aligns the one or more pickup heads 724 with the target substrate 560 based on the images, and places the LEDs 100 attached to the one or more pickup heads 724 on the target substrate 560. Each pickup head 724 may be optically translucent, transparent, or some combination thereof, allowing the imaging device to capture the alignment of the pickup head 724 through the pickup head 724 itself.

In some embodiments, the imaging device 708 is an environmental scanning electron microscope (ESEM) to provide images without specimen coating. In these embodiments, the environment 702 is an ESEM chamber including a high pressure atmosphere of water vapor. The use of an SEM is advantageous for picking and place small semiconductor device, such as micro-LED dies. In various embodiments, other types of imaging devices may be used to facilitate the alignments.

The heat source 710 provides heat to facilitate thermal compressive bonding between the LED 100 and the target substrate 560. The pickup head 724 aligns the LED 100 with the target substrate 560, such that electrodes of the LED 100 (e.g., the electrode 540) align with electrical contact pads (e.g., the pad 550) of the target substrate 560. The heat source 710 provides heat to the electrodes and the corresponding pads to facilitate bonding. In some embodiments, the heat source 710 may be coupled to the target substrate 560 and/or the target stage 720.

In some embodiments, the carrier stage 316 and/or target stage 720 can be adjusted to facilitate precision alignment with the pickup assembly 704. For example, the carrier stage 316 and/or target stage 720 may include three degrees of freedom. The degrees of freedom may include left and right, backward and forward, and a yaw rotational degree of freedom. The temporary substrate 220 is moved with the carrier stage 316, and the target substrate 560 is moved with the target stage 720.

The system 700 may include one or more temporary substrates 220. For example, different temporary substrates 210 may carry different color LED dies. A temporary substrate 220 may be carrier film that holds singulated LEDs for transfer to the target substrate 560. The system may include one or more target substrates 560. In some embodiments, such as when the target substrate 560 is the target substrate for receiving the LEDs 100, the target stage 720 includes a heater for thermal conductive bonding of the electrical contact pads of the LEDs 100 to the target substrate 560 subsequent to placement of the LEDs 100 on the target substrate 560 by the pickup head 724. In other embodiments, the target substrate 560 is an intermediate carrier substrate that is used to facilitate direct bonding of the LEDs 100 with a separate target substrate 560 (e.g., using a direct bonding process).

In some embodiments, the system 700 includes multiple pickup assemblies 704 each positioned at a separate station. Each station may be dedicated to the pick and place of a color LED, such as a green station for green LEDs, a red station for red LEDs, and a blue station for blue LEDs, etc.

The laser source 726 is a device for emitting a light that detaches the native substrate layer 210 from the LEDs. The process of using the laser source 726 to detach the native substrate layer 210 is referred to herein as a laser lift-off (LLO) operation. In some embodiments, the laser source 726 projects a laser light passes through the native substrate layer 210 and be absorbed by the gallium semiconductor layer of the LEDs 100. For example, the laser source 726 may project a pulse ultraviolet laser that passes through a sapphire substrate layer 210 to be absorbed by the gallium semiconductor layer of the LEDs 100. In other embodiments, where the substrate layer 210 comprises gallium arsenide, the laser source 726 projects an IR laser. Absorption of the laser light projected by the laser source 726 causes a portion of the gallium semiconductor layer to separate into its component elements and weakens the bond between the gallium semiconductor layer of the LEDs 100 and the native substrate 210, allowing for the LEDs 100 and the native substrate 210 to be separated. The laser lift-off actuator 750 may remove the native substrate 210 from the LEDs 202 after the bonding is weakened.

In some embodiments, the laser source 726, instead of being configured to project a laser through the native substrate 210, projects the laser at a junction of the native substrate 210 and the gallium semiconductor layer of the LEDs 100. As such, the projected laser may not need to pass through the native substrate 210. In these embodiments, the native substrate 210 may comprise a material not substantially transparent to the laser projected by the laser source 726.

In some embodiments, another laser (not shown) generates a laser light to singulate the LEDs 100 on the temporary substrate 220. Multiple LEDs 100 may be fabricated on the native substrate 210 and singulated on the temporary substrate 220. In some embodiments, the laser light is directed through the temporary substrate 220. The temporary substrate may include a carrier tape or other adhesive layer to hold the LEDs 100 in place with an adhesion force. In some embodiments, the laser light reduces the adhesion force to facilitate pick up of the LEDs 100 by the pickup assembly 704. In some embodiments, the system 700 includes a mechanical dicer to singulate the LEDs 100, such as a diamond based cutting wheel.

In some embodiments, the controller 706, in addition to controlling an alignment of the pickup heads 724 of the pickup assembly 704 (e.g., using actuators 722), may also control a temperature of the environment 702. In some embodiments, the controller 706 may alter the temperature of the environment 702 to change a temperature of the LEDs 100. For example, the controller 706 may operate one or more heating coils (not shown) in the environment 702 to raise a temperature of the LEDs 100. In other embodiments, the carrier stage 316 or other component may contain a heater able to directly heat one or more of the LEDs 100. In some embodiments, the temperature of the environment 702 is controlled using a separate temperature controller (not shown).

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
    placing a conformable layer at an end of a pickup head on a top surface of a light emitting diode (LED) on a temporary substrate, the conformable layer configured to attach the LED onto the conformable layer and the pickup head made of a material having a coefficient of thermal expansion substantially identical to a coefficient of thermal expansion of a body of the LED;
    removing the LED from the temporary substrate by causing a relative movement between the pickup head and the temporary substrate;
    placing the LED onto a target substrate by causing a relative movement between the pickup head and the target substrate; and
    bonding an electrode of the LED to a corresponding pad on the target substrate by increasing temperature of the electrode and the corresponding pad.

2. The method of claim 1, wherein bonding the electrode of the LED to the corresponding pad on the target substrate further comprises applying pressure to the electrode and the corresponding pad.

3. The method of claim 1, wherein the conformable layer comprises polydimethylsiloxane (PDMS).

4. The method of claim 1, wherein the relative movement between the pickup head and the target substrate comprises:
    removing the LED from the temporary substrate after placing the conformable layer on the top surface of the LED on the temporary substrate;
    placing the LED onto a target substrate; and
    releasing the LED onto the target substrate.

5. The method of claim 1, wherein the pickup head is made of fused silica.

6. The method of claim 1, further comprising:
    removing, by etching, a portion of a polymer securing the LED to the target substrate before removing the LED from the temporary substrate.

7. The method of claim 1, wherein a plurality of LEDs including the LED are simultaneously removed from the temporary substrate by a corresponding plurality of pickup heads including the pickup head, and wherein the plurality of LEDs are simultaneously bonded to the target substrate by the plurality of pickup heads.

8. The method of claim 1, wherein a feature size of the LED is from 0.1 µm to 10 µm.

9. An apparatus comprising:
    a pickup head made of a material having a coefficient of thermal expansion substantially identical to a coefficient of thermal expansion of a body of a light emitting diode (LED);
    a conformable layer on an end of the pickup head and configured to attach the LED to the pickup head and detach the LED from the pickup head after attaching the LED to a target substrate, the conformable layer remaining on the end of the pickup head after attaching the LED to the target substrate; and an actuator coupled to the pickup head and configured to cause relative movement between the pickup head and the target substrate.

10. The apparatus of claim 9, further comprising:

a heat source coupled to the target substrate, the heat source configured to increase temperature of an electrode of the LED and a corresponding pad on the target substrate for bonding of the electrode to the corresponding pad.

11. The apparatus of claim 9, wherein the pickup head is part of a pickup assembly that is operated by the actuator, the pickup assembly comprising other pickup heads and corresponding conformable layers for attaching to a plurality of LEDs including the LED.

12. The apparatus of claim 9, wherein the actuator is further configured to apply pressure to an electrode of the LED and a corresponding pad on the target substrate to bond the electrode and the corresponding pad.

13. The apparatus of claim 9, wherein the relative movement between the pickup head and the target substrate comprises:

a first movement that removes the LED from a temporary substrate;

a second movement that places the LED removed from the temporary substrate onto the target substrate; and a third movement that detaches the LED from the pickup head.

14. The apparatus of claim 9, wherein the pickup head is made of fused silica.

15. The apparatus of claim 9, wherein the conformable layer comprises polydimethylsiloxane (PDMS).

16. The apparatus of claim 9, wherein a feature size of the LED is from 0.1 μm to 10 μm.

* * * * *